(12) United States Patent
Rivoir

(10) Patent No.: US 8,253,605 B2
(45) Date of Patent: Aug. 28, 2012

(54) DECORRELATION OF DATA BY USING THIS DATA

(75) Inventor: Jochen Rivoir, Magstadt (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 703 days.

(21) Appl. No.: 12/282,139

(22) PCT Filed: Mar. 5, 2007

(86) PCT No.: PCT/EP2007/001873
§ 371 (c)(1),
(2), (4) Date: Apr. 24, 2009

(87) PCT Pub. No.: WO2007/101645
PCT Pub. Date: Sep. 13, 2007

(65) Prior Publication Data
US 2011/0254719 A1    Oct. 20, 2011

(30) Foreign Application Priority Data

Mar. 7, 2006 (EP) .................................. 06110749

(51) Int. Cl.
*H03M 7/00* (2006.01)
*H03M 1/00* (2006.01)

(52) U.S. Cl. .......................................... 341/50; 341/110
(58) Field of Classification Search .................. 341/50, 341/55, 58, 59, 110, 144, 155
See application file for complete search history.

(56) References Cited

U.S. PATENT DOCUMENTS

| | | | |
|---|---|---|---|
| 3,784,743 A * | 1/1974 | Schroeder | 380/46 |
| 4,304,962 A * | 12/1981 | Fracassi et al. | 380/42 |
| 5,946,355 A | 8/1999 | Baker | |
| 6,304,482 B1 * | 10/2001 | Lin et al. | 365/154 |
| 7,006,016 B1 | 2/2006 | Feng | |
| 7,158,058 B1 * | 1/2007 | Yu | 341/58 |
| 7,269,778 B1 * | 9/2007 | Feng et al. | 714/758 |
| 2003/0145196 A1 * | 7/2003 | Heegard et al. | 713/150 |
| 2005/0047512 A1 * | 3/2005 | Neff et al. | 375/259 |
| 2005/0078016 A1 * | 4/2005 | Neff | 341/50 |

FOREIGN PATENT DOCUMENTS

WO    WO 2007/101645    9/2007

* cited by examiner

*Primary Examiner* — Howard Williams
(74) *Attorney, Agent, or Firm* — Holland & Hart LLP

(57) ABSTRACT

A device for processing data adapted for being converted between an analog format and a digital format, the device having a scrambling unit adapted for scrambling the data based on at least a part of the data to thereby decorrelate the data in the analog format with respect to the data in the digital format.

22 Claims, 3 Drawing Sheets

DECORRELATION OF DATA BY USING THIS DATA

BACKGROUND OF THE INVENTION

The present invention relates to scrambling of data.

Switching activity from the digital outputs of an analog-to-digital converter (ADC) may couple into the analog signal path, resulting in spurs or other signal distortions, because the most significant bits are highly correlated with a digital signal.

Robert Jewett, Ken Poulton, Kuo-Chiang Hsieh, Joey Doernberg, "A 12 bit 128 MSample/s ADC with 0.05 LSB DNL", IEEE International Solid-State Circuits Conference, 1997, Paper FA 8.4, p. 138 introduces XOR scrambling with a random signal to decorrelate the digital outputs from the analog input and thus convert the coupling power into broadband noise. The scrambling signal is provided as a separate signal for descrambling. When connecting accordingly scrambled 16 bit ADCs to a test device for testing a device under test (DUT), for instance a 93000 apparatus of Agilent Technologies, having a test processor with 8 bit wide vectors, the additional scrambling bit leads to inefficient sample sizes.

Such a decorrelation of transmitted digital signals with a random signal that logically processes the data bits according to an XOR logic and that is transmitted along with the randomized data as an additional signal introduces a random signal coming, for instance, from an LFSR (Linear Feedback Shift Register).

Random scrambling may allow to have improved spur suppression. Coupling power may be converted from spurs into broadband noise.

However, the random scrambling approach may necessitate an additional pin for carrying the random signal, and the implementation of an LFSR or a random signal generation unit may introduce additional noise so as to deteriorate the signal transmission quality.

U.S. Pat. No. 7,006,016 discloses a data encoding system for a data stream, which comprises a data dependent scrambler that receives the data stream including K m-bit symbols, that selects a seed based on the K m-bit symbols, that scrambles the K m-bit symbols using the seed and that outputs a codeword including the scrambled K m-bit symbols and the seed. A DC control module receives a plurality of the codewords from the data dependent scrambler, selectively inverts selected ones of the plurality of codewords to reduce a difference between a total number of zeroes and total number of ones in the plurality of codewords and outputs an encoded data stream.

SUMMARY

According to an embodiment, a device may have a scrambling unit adapted for scrambling a digital version of the data into scrambled digital data based on at least a part of the digital version of the data to thereby decorrelate the scrambled digital data with respect to an analog version of the data, wherein said scrambling includes logically combining bits of the digital version of the data with each other.

According to an embodiment, a measurement apparatus may have a data generation unit adapted to generate data related to a measurement carried out by the measurement apparatus; a device for processing data, the device having a scrambling unit adapted for scrambling a digital version of the data into scrambled digital data based on at least a part of the digital version of the data to thereby decorrelate the scrambled digital data with respect to an analog version of the data, wherein said scrambling includes logically combining bits of the digital version of the data with each other, for processing the generated data so as to scramble the generated data based on at least a part of the generated data.

According to an embodiment, a method of processing data may have the step of scrambling a digital version of the data into scrambled digital data based on at least a part of the digital version of the data to thereby decorrelate the scrambled digital data with respect to an analog version of the data, wherein said scrambling includes logically combining bits of the digital version of the data with each other.

According to an embodiment, a computer-readable medium is provided in which a computer program of processing data is stored, which computer program, when being executed by a processor, is adapted to control or carry out a method of scrambling a digital version of the data into scrambled digital data based on at least a part of the digital version of the data to thereby decorrelate the scrambled digital data with respect to an analog version of the data, wherein said scrambling includes logically combining bits of the digital version of the data with each other.

According to an embodiment, a program element of processing data is provided, which program element, when being executed by a processor, is adapted to control or carry out a method of scrambling a digital version of the data into scrambled digital data based on at least a part of the digital version of the data to thereby decorrelate the scrambled digital data with respect to an analog version of the data, wherein said scrambling includes logically combining bits of the digital version of the data with each other.

According to an embodiment, a device for processing data may have a descrambling unit adapted for descrambling scrambled digital data into a digital version of the data based on at least a part of the scrambled digital data so that the scrambled digital data provided at a digital input of the descrambling unit is decorrelated with respect to an analog version of the data, wherein said descrambling includes logically combining bits of the scrambled digital data with each other.

According to an embodiment, a method of processing data may have the steps of descrambling scrambled digital data into a digital version of the data based on at least a part of the scrambled digital data so that the scrambled digital data provided at a digital input is decorrelated with respect to an analog version of the data, wherein said descrambling includes logically combining bits of the scrambled digital data with each other.

According to an exemplary embodiment of the present invention, a device for processing data adapted for being converted between an analog format and a digital format is provided, the device comprising a scrambling unit adapted for scrambling the data based on at least a part of the data to thereby decorrelate the data in the analog format with respect to the data in the digital format.

According to another exemplary embodiment, a measurement apparatus is provided, the measurement apparatus comprising a data generation unit adapted to generate data related to a measurement carried out by the measurement apparatus, and a device having the above mentioned features for processing the generated data so as to scramble the generated data based on at least a part of the generated data.

According to still another exemplary embodiment, a method of processing data adapted for being converted between an analog format and a digital format is provided, the method comprising scrambling the data based on at least a part of the data to thereby decorrelate the data in the analog format with respect to the data in the digital format.

According to yet another exemplary embodiment, a computer-readable medium is provided, in which a computer program of processing data adapted for being converted between an analog format and a digital format is stored, which computer program, when being executed by a processor, is adapted to control or carry out the above-mentioned method.

According to a further exemplary embodiment, a program element of processing data adapted for being converted between an analog format and a digital format is provided, which program element, when being executed by a processor, is adapted to control or carry out the above-mentioned method.

According to a further exemplary embodiment, a device for processing data adapted for being converted between an analog format and a digital format is provided, the device comprising a descrambling unit adapted for descrambling the data based on at least a part of the data so that the data provided in the digital format at a digital input of the descrambling unit is decorrelated to data in the analog format.

According to still another exemplary embodiment, a method of processing data adapted for being converted between an analog format and a digital format is provided, the method comprising descrambling the data based on at least a part of the data so that the data provided in the digital format at a digital input is decorrelated to data in the analog format.

Embodiments of the invention can be partly or entirely embodied or supported by one or more suitable software programs, which can be stored on or otherwise provided by any kind of data carrier, and which might be executed in or by any suitable data processing unit. Software programs or routines can be advantageously applied for signal scrambling or descrambling. The data-based scrambling scheme according to an embodiment of the invention can be performed by a computer program, i.e. by software, or by using one or more special electronic optimization circuits, i.e. in hardware, or in hybrid form, i.e. by means of software components and hardware components.

The term "data adapted for being converted between an analog format and a digital format" may particularly denote data being in a format so as to be indicative of analog information. This may include analog data or digital data carrying information derived or derivable from analog data. Particularly, embodiments of the invention may be implemented in a system dealing with analog data and digital data, for instance converting analog data into digital data, and/or vice versa. In such a scenario, data scrambling may be advantageous to prevent or suppress signal distortion resulting from an undesired cross talk between analog and digital data. Examples for such systems are ADCs and DACs.

The term "scrambling", or more particularly "decorrelating" may include applying a (linear) XOR function, or may include arithmetic additions (so that the scrambled data is obtained by adding a constant to the unscrambled data).

According to an exemplary embodiment, spur suppression in a data transmission path, for instance implementing a conversion between analog and digital data, may be performed using data driven scrambling. In other words, the data to be processed or transmitted is used at least partially directly as a signal to scramble the data. In other words, instead of providing a separate random signal generation unit as a source for a random scrambling signal for scrambling data, the transmitted data is used a source to scramble these data. Thus, a self-contained data-based data scrambling architecture may be implemented.

Such a system may be implemented in the context of the transmission of digital information representing physically close analog signals. Such systems include data outputs of ADCs (analog-to-digital converter) and data inputs of DACs (digital-to-analog converter). In such a scenario, switching noise of digital signals may couple into analog signals. The digital MSBs (Most Significant Bits) are usually highly correlated to the analog signal. Their coupling power conventionally shows up as spurs. In order to substitute or supplement common approaches to reduce the coupling like shielding, layout, differential signalling, embodiments of the invention utilize the data signal itself to scramble this data signal. In other words, a combination of the data signal with the data signal based on an appropriate logic linkage scheme may be used to suppress or eliminate spurs in a digital and/or analog signal transmission scheme.

Such a spur suppression unit using data driven scrambling may be implemented particular in a testing device. For testing electronic devices, in particular integrated electronic circuits providing digital electronic output signals, a test or stimulus signal may be fed to an input of the device under test, and a response signal of the device under test may be evaluated by an automatic test equipment, for example by comparison with expected data. Such an automatic test equipment has included a particular test functionality, that is to say test functions or routines which the test equipment may carry out. The test functionality may be incorporated in a test equipment in the form of executable software code. When test signals are transmitted within such an electronic test device, it may also happen that signals are converted between analog and digital format. In order to suppress spurs which may occur in such a conversion scheme, embodiments of the invention use the test signals themselves to scramble the test signals which may help to suppress spurs. After descrambling, the test signals may be further processed or analyzed.

Thus, embodiments of the invention may be implemented between a test processor and the pin electronics, or within the test device. More generally, the spur suppression by data driven scrambling may be implemented in any information transmission path implementing a converter (like a DAC or an ADC) for providing the data to a user. Switching may cause distortions on the analog signal side and may deteriorate the signal quality. Undesired cross coupling of signals may occur. When switching between logical values of "0" and "1" occurring in a digital signal, such switching artefacts may couple, for instance capacitively or inductively, into an analog signal path. When the digital signals are scrambled along at least a part of the transmission path, such artefacts may be avoided or reduced.

A partial randomization may be obtained by scrambling such a data signal with this data signal. Since the data signal has to be transmitted anyway, no additional line is needed for transmitting an artificially generated separate random generation signal for scrambling and descrambling. Since the signal itself is, of course, transmitted anyway, it can be used for scrambling and descrambling.

As compared to a pure random approach, embodiments of the invention do not necessitate an additional line which would otherwise lack for signal transmission. Thus, an efficient high-bandwidth transmission scheme may be implemented according to an exemplary embodiment. Furthermore, the expenditure for providing a random signal generation unit, on both the scrambling and descrambling side, may be avoided and any distortions caused by such a generation unit may be avoided as well.

Particularly a Least Significant Bit (LSB) which does not have too many signal characteristics in common with the entire signal may be appropriate as a (pseudorandom-like) scrambling signal which is relatively uncorrelated with the data signal. Thus, such a bit, another bit of the transmitted data, a part of the data signal or the entire data signal may be used for scrambling and/or descrambling. A logical processing of the data signal with the scrambling signal may be performed, for instance an XOR logical operation, an AND logical operation, an OR logical operation, a logical NOT operation, or any other Boolean function or any combination of different Boolean functions.

In other words, the scrambled data word may be a function of the input word and/or of the preceding input word. In other words, actual or historical data transmitted over a transmission path may be used for scrambling a signal. Using actual and/or historical (this is previously transmitted) data for scrambling of actually/presently transmitted data may suppress spurs and may therefore improve the data transmission quality. When using historical data for this purpose, this may be stored in a memory (for instance a ring buffer).

In the following, a formal description of an exemplary embodiment of the invention will be described.

Instead of using a dedicated truly random signal, the "randomness" in the LSBs of a digital signal may be exploited to randomize all data bits. It is believed that this randomness originates from the non-linear nature of quantization, and, in case of ADC data, additionally from omnipresent thermal noise.

For instance, the scrambled bits may be simple, linear (for instance XOR) functions of the unscrambled data bits, with as many LSBs included as desired or possible.

In general, although not absolutely of importance, the scrambled bits X are an invertible Boolean vector function f( ) of the unscrambled bits D. Descrambling applies the inverted Boolean vector function g( ) to X.

$$X = (X_0, X_1, \ldots, X_{B-1})$$

$$D = (D_0, D_1, \ldots, D_{B-1})$$

$$X = f(D)$$

$$X_i = f_i(D_0, \ldots, D_{B-1}); i = 0 \ldots B-1 \quad (1)$$

$$g(\cdot) = f^{-1}(\cdot)$$

$$Y = g(f(D)) = D$$

$$Y_i = g_i(X_0, \ldots, X_{B-1}) = D_i; i = 0 \ldots B-1 \quad (2)$$

In the following, linear data driven scrambling will be explained.

In this context, "+" may denote logical EXCLUSIVE OR (XOR), "·" may denote logical AND, rules of Galois Field, GF(2), apply.

When f( ) is a linear vector function of D, it can be represented by a regular (invertible) scrambling matrix F. g( ) is given by a descrambling matrix G, the inverted F matrix and GF(2).

$$X_i = F_{i0} \cdot D_0 + F_{i1} \cdot D_1 + \ldots + F_{i,B-1} D_{B-1}; i = 0 \ldots B-1 \quad (3)$$

$$X_i = \sum_{k=0}^{B-1} F_{ik} \cdot D_k$$

$$X = F \cdot D$$

$$\text{rank}(F) = B$$

$$G = F^{-1} \quad (4)$$

$$Y = G \cdot X = F^{-1} \cdot F \cdot D = D$$

$$Y_i = G_{i0} \cdot X_0 + G_{i1} \cdot X_1 + \ldots + G_{i,B-1} X_{B-1}; i = 0 \ldots B-1$$

$$Y_i = \sum_{k=0}^{B-1} G_{ik} \cdot X_k$$

Still referring to linear data driven scrambling, a first example is given related to a scrambling with a Least Significant Bit (LSB). This example may be described mathematically by the following formulas:

$$X_0 = D_0 \quad (5)$$

$$X_i = D_i + D_0; i = 1 \ldots B-1$$

$$F_{ik} = \begin{cases} 1 & i = k, i = 0 \\ 0 & i \neq k \end{cases}$$

$$G = F$$

$$F = \begin{pmatrix} 1 & 0 & 0 & \ldots & 0 \\ 1 & 1 & 0 & \ldots & 0 \\ 1 & 0 & 1 & \ldots & 0 \\ \vdots & \vdots & \vdots & \ddots & \vdots \\ 1 & 0 & 0 & \ldots & 1 \end{pmatrix} \quad (6)$$

As a second example, scrambling with all but one data bits (even B) will be described. Such an embodiment may be particularly advantageous because it may significantly increase, or maximize, the number of involved data bits, increasing or maximizing randomness. Excluding one data bit per column makes rows linearly independent (F regular), for even B. This will be illustrated by the following formulas:

$$X_i = \sum_{\substack{k=0 \\ k \neq i}}^{B-1} D_k; i = 0 \ldots B-1 \quad (7)$$

$$F_{ik} = \begin{cases} 1 & i \neq k \\ 0 & i = k \end{cases}$$

$$G = F; \text{ for even } B$$

$$F = \begin{pmatrix} 0 & 1 & 1 & \ldots & 1 \\ 1 & 0 & 1 & \ldots & 1 \\ 1 & 1 & 0 & \ldots & 1 \\ \vdots & \vdots & \vdots & \ddots & \vdots \\ 1 & 1 & 1 & \ldots & 0 \end{pmatrix} \quad (8)$$

A third example for linear data driven scrambling relates to the data (odd B).

For odd B, for instance $F_{00}$ can be set to 1, compared to the second example, to make F regular:

$$X0 = \sum_{k=0}^{B-1} D_k \quad (9)$$

$$X_i = \sum_{\substack{k=0 \\ k \neq i}}^{B-1} D_k; i = 1 \ldots B-1$$

$$F_{ik} = \begin{cases} 1 & i \neq k, i = 0 \\ 0 & \text{else} \end{cases}$$

$$G = F; \text{ for odd } B$$

-continued $$F = \begin{pmatrix} 1 & 1 & 1 & \ldots & 1 \\ 1 & 0 & 1 & \ldots & 1 \\ 1 & 1 & 0 & \ldots & 1 \\ \vdots & \vdots & \vdots & \ddots & \vdots \\ 1 & 1 & 1 & \ldots & 0 \end{pmatrix} \quad (10)$$

Thus, methods and apparatuses are provided according to an exemplary embodiment, wherein scrambled bits are an invertible logical function of the unscrambled bits (i.e. no other input parameter), and descrambling is an inverted function. This system may be implemented with a linear XOR function, a regular scrambling matrix, and a descrambling matrix that may be the inverted scrambling matrix.

According to an exemplary embodiment, a system is provided in which digital data is scrambled, the scrambled data is transmitted, the transmitted scrambled data is descrambled, and the descrambled data is converted by a DAC into an analog format.

According to another exemplary embodiment, a system is provided in which analog data is converted by an ADC into a digital format, the converted data is scrambled, the scrambled data is transmitted, and the transmitted scrambled data is descrambled.

Next, further exemplary embodiments of the invention will be described. In the following, further exemplary embodiments of the device for processing data will be explained. However, these embodiments also apply for the measurement apparatus, for the method of processing data, for the computer-readable medium and for the program element.

The scrambling unit may be adapted for scrambling currently processed data based on the currently processed data. Thus, the actually processed data stream may be used simultaneously for both, as a data carrier and as a source for scrambling and/or descrambling.

The scrambling unit may further be adapted for scrambling currently processed data based on previously processed data. Such historical data may be stored in a (for instance a register chain, or FIFO, or cache) memory device and may be used later as a source for scrambling data. Since the correlation between previously processed data and actually processed data may be even lower than a correlation between currently processed data and (a part of) the currently processed data, the scrambling functionality may be further improved.

The scrambling unit may be further adapted for scrambling currently processed data based on the currently processed data and based on previously processed data. A combination of previously and currently processed data may further strengthen the decorrelation and thus improve the spur suppression.

The scrambling unit may be adapted for scrambling the data based on one bit of the data. By taking only one bit, particularly the Least Significant Bit, a sufficiently low correlation between data and scrambling signal may be ensured, and the scrambling and descrambling procedure may be performed with low computational burden.

The scrambling unit may further be adapted for scrambling the data based on the entire data. Taking this measure may allow to mix up the data properly, since a large amount of data is used as a scrambling data source.

The scrambling unit may further be adapted for scrambling the data by logically combining the data with at least a part of the data. Such a logical combination may include an invertible Boolean function, like an XOR function, an AND function, an OR function, an inverter function, or any logical combination of these or other logical functions. Such a logical combination which may be reversible may allow to quickly and reliably scramble the signals so as to avoid spurs or other data processing artefacts.

The scrambling unit may be adapted for scrambling the data based on at least a part of the data and additionally based on a random signal provided by a random signal generation unit. By combining the advantages of a random scrambling and a data based scrambling, a high quality scrambling and descrambling system may be provided.

The device may comprise a conversion unit for converting the data into converted data, particularly for converting analog data into digital data, or vice versa. Thus, the conversion unit may be an ADC or a DAC. The implementation of the scrambling scheme according to an exemplary embodiment of the invention in the scenario of a conversion between analog and digital data may improve the conversion quality, since switching signals occurring when the digital signal performs a transition between "high" and "low" may be suppressed, and the influence of such switches on the analog signal may be eliminated or reduced. Thus, the deterioration of the signal by such switching artefacts may be reduced.

Furthermore, the device may comprise a descrambling unit adapted for descrambling the scrambled data based on at least a part of the data. By taking this measure, the data can be recovered from the scrambled data so that the content of the data may be used for further analysis or processing.

In the following, further exemplary embodiments of the measurement device will be explained. However, these embodiments also apply for the device for processing data, for the method of processing data, for the program element and for the computer-readable medium.

The measurement apparatus may comprise at least one of an analog-to-digital converter, a digital-to-analog converter, a sensor device, a test device for testing a device under test or a substance, a device for chemical, biological and/or pharmaceutical analysis, a fluid separation system adapted for separating compounds of a fluid, a capillary electrophoresis device, a liquid chromatography device, a gas chromatography device, an electronic measurement device, and a mass spectroscopy device. More generally, the measurement apparatus can be a measurement apparatus of any technical field in which a signal scrambling and/or descrambling may be advantageous. Thus, the measurement apparatus may find application in many fields of electronics and measurement applications, for instance in the life science regime, or in any field of analog or digital electronics in which spur suppression might be an issue.

BRIEF DESCRIPTION OF THE DRAWINGS

Other objects and many of the attendant advantages of embodiments of the present invention will be readily appreciated and become better understood by reference to the following more detailed description of embodiments in connection with the accompanied drawings. Features that are substantially or functionally equal or similar will be referred to by the same reference signs.

Figure 1:
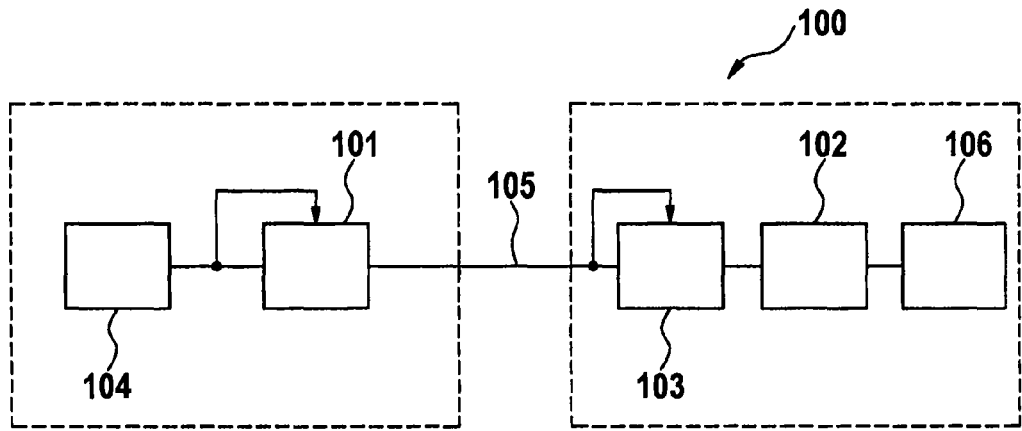
FIG. 1 to FIG. 3 show devices for processing data according to exemplary embodiments of the invention.

The illustration in the drawing is schematically.

In the following, referring to FIG. 1, a device 100 for processing data according to an exemplary embodiment of the invention will be described.

DETAILED DESCRIPTION OF THE INVENTION

The device 100 is adapted for processing a digital signal provided by a digital data source 104. The signal provided by the digital data source 104 is provided to a scrambling unit 101 for scrambling the data based on a part of the data. In other words, the data itself is processed by the scrambling unit 101 so as to suppress spurs which may occur in the signal transmission path of FIG. 1, and the digital data emitted by the digital data source 104 itself is used as some kind of control signal for controlling or performing the scrambling of the scrambling unit 101.

At an output of the scrambling unit 101, the scrambled data is provided and is transmitted along a signal transmission path 105.

After having traversed this path 105, the scrambled data is provided to an input of a descrambling unit 103. The descrambling unit 103 descrambles the scrambled data so as to recover the original data provided by the digital data source 104. For this purpose, the scrambled data is used as a control signal for performing the descrambling of the scrambled data. In other words, using the scrambled data, the descrambling of the scrambled data may be performed in the descrambling unit 103.

At an output of the descrambling unit 103, the recovered data is provided and is input to an input of a digital-to-analog converter 102. The digital-to-analog converter 102 converts the data at its input being in a digital format into analog data provided at an output of the digital-to-analog converter 102. This data may further be provided to analog data processing destination unit 106.

By scrambling and descrambling the data based on this data, spurs which may occur due to switch effects of the digital data emitted by the data generation unit 104 may be efficiently suppressed so that the signal processing of the device 100 may be significantly improved.

Figure 2:
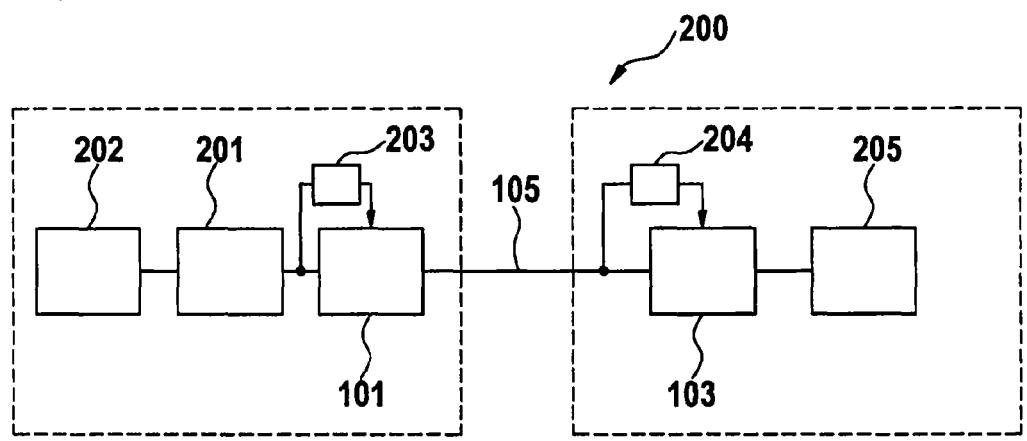

FIG. 2 illustrates a device 200 for processing data according to another exemplary embodiment of the invention.

According to FIG. 2, an analog data source 202 emits analog data and provides the latter to an input of an analog-to-digital converter unit 201. At an output of the analog-to-digital converter unit 201, digital data is provided. This data is supplied to a scrambling unit 101 for scrambling the actually processed data by previously processed data which is provided at a control input of the scrambling unit 101. For this purpose, a delay unit 203 is foreseen between the output of the ADC 201 and the control input of the scrambling unit 101 so as to delay the historical data used for scrambling the actually processed data.

After having transmitted the data along a transmission path 105, the scrambled data is input to a descrambling unit 103. In contrast to FIG. 1, the descrambled data 103 is descrambled using control data which is previously scrambled data, wherein a delay unit 204 performs an appropriate delay. Consequently, the actually processed scrambled data is descrambled by the descrambling unit 103 and is provided to a digital data processing destination 205.

Figure 3:
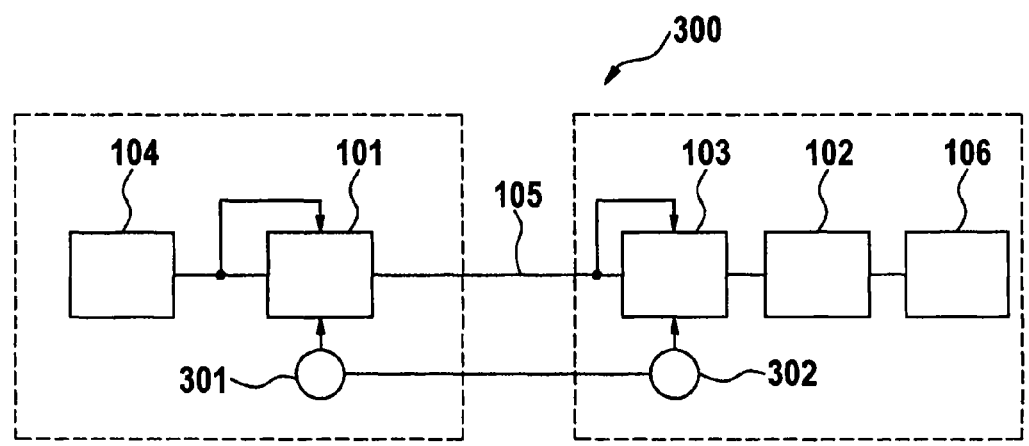

In the following, a device 300 for processing data according to an exemplary embodiment of the invention will be described referring to FIG. 3.

The device 300 differs from the device 100 in that a random scrambling signal generation unit 301 is provided additionally which is coupled to the scrambling unit 101. Furthermore, another scrambling signal generation unit 302 which is synchronized with this random signal generation unit 301 is coupled to the descrambling unit 103. In the embodiment of FIG. 3 the scrambling and the descrambling is performed by both, the actual data and the random scrambling data provided by the units 301, 302.

In the following, scrambling of ADC data will be described in more detail.

Embodiments of the invention show that state-less, purely data driven scrambling, which does not necessitate an additional signal, achieves almost the same spur suppression as true random scrambling.

A simple descrambling architecture, which can handle all relevant, data driven (and additionally random driven) scrambling methods, will be described in the following, particularly for test processors. Particularly, analog front end chips for the Agilent 93000 test device may support compatible data scrambling.

Next, it will be explained how spurs from correlated noise may occur.

Figure 4:
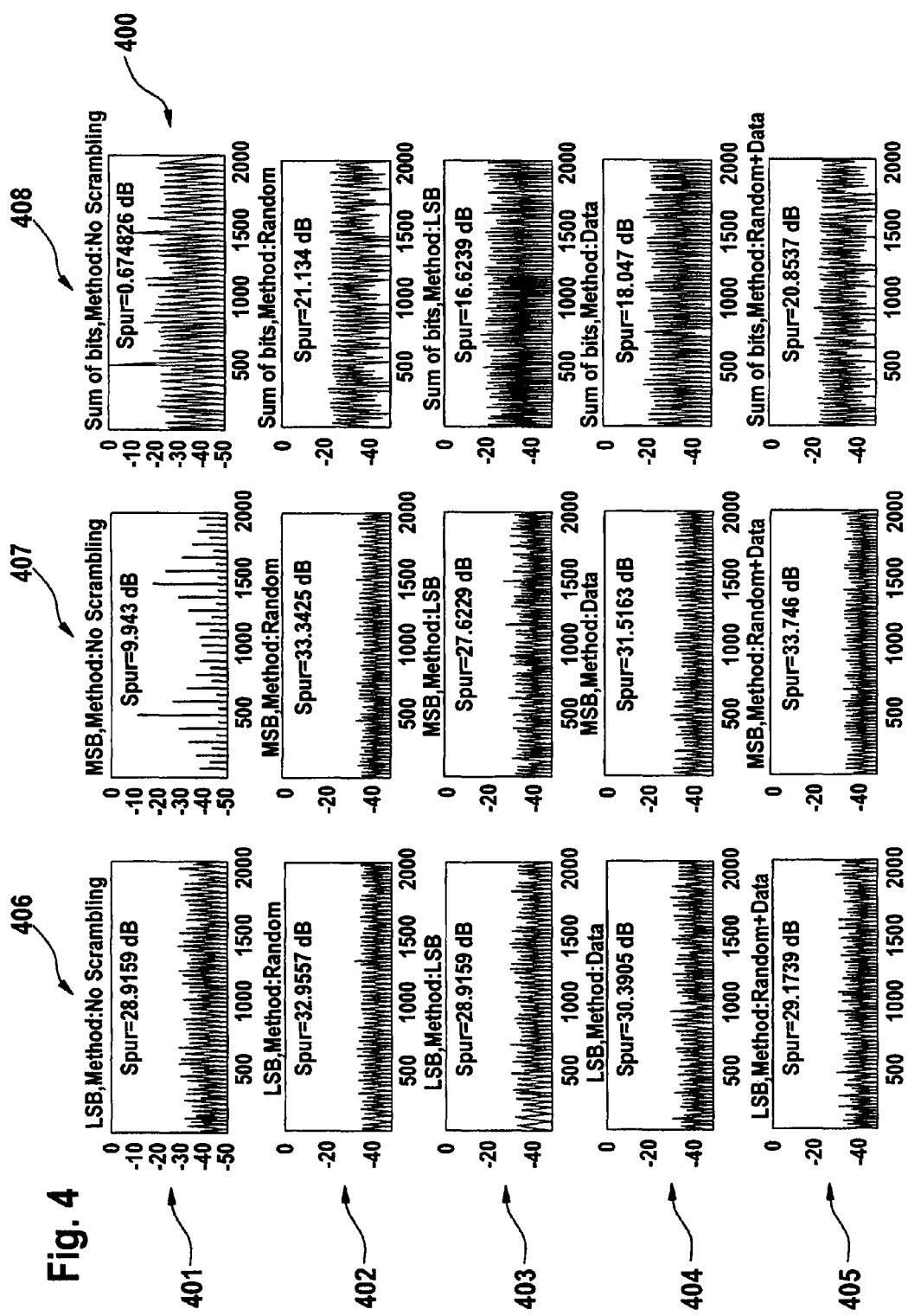
FIG. 4 shows diagrams illustrating signals processed according to different exemplary embodiments of the invention.

In particular for large and slow signals, the Most Significant Bits are highly correlated with the converted signal amplitude. A first row 401 of a diagram 400 of FIG. 4 shows the spectra of the LSB, the MSB and the superposition of all 16 data bits from a 16 bit ADC that is stimulated with a single sine wave with 499 periods in 4096 samples, where the amplitude is close to full scale. Thus, the first row 401 shows the power spectral density of digital ADC outputs with sinusoidal input.

The MSB exhibits a strong −9.9 dB spur at the sine frequency in addition to a comb of other strong spurs. The LSB shows an almost flat power spectrum density, resembling a random wide noise signal.

The superimposed arithmetic sum of all data bits, which models the aggregate interference, carries a very strong −0.7 dB spur at the sine frequency.

Because of the unknown coupling factor, the absolute spur level has no meaning, only the ratios are relevant.

Next, different scrambling methods will be explained which may overcome or reduce the problem with spurs.

Various simple state-less, XOR based scrambling methods will be explained in the following. The scrambling signal combines a subset of a random signal and data bits, in a linear (XOR) function.

The following signals for scrambling will be compared: A random signal only ("Random"), the ADC's LSB only ("LSB"), all ADC data bits ("Data"), and a random signal and all ADC data bits ("Random+Data").

Where used, a random signal is directly or indirectly transmitted over the scrambled data bus, allowing a stateless descrambling. This necessitates an additional bit, which means that a 16 bit data bus can support only up to 15 converter bits.

Theoretically, it will be possible to let scrambler and descrambler agree on an implicit random bit sequence for scrambling and descrambling. However, this would necessitate additional (non-trivial) synchronization, which is not needed otherwise. Because simple data driven scrambling methods without any truly random signal performs well enough, more complex scrambling schemes, as known from line coding, or schemes with implied randomness seem not justified, but are however possible and may be implemented as well according to exemplary embodiments of the invention.

In the following, D denotes the digitized word, s is a scalar scrambling signal, X is the scrambled word with B bits, d is the scalar descrambling signal, and Y is the descrambled word, which should equal D. Bit numbers start counting with zero; the MSB is at bit position B-1. A 16 bit wide scrambled data port X which supports 15/16 bit wide ADCs, is used for explanation.

In the following, the method "Random" will be explained.

This method uses a random bit signal r as a scrambling signal s, which is bitwise processed according to an XOR function with up to 15 ADC data bits D[15:1]. For simple descrambling, the random scrambling signal s is transmitted as the LSB of X, X[0], along with the scrambled ADC bits X[15:1], where it is used (d) to apply a second XOR operation in order to reverse the first (scrambling) XOR.

% Scramble
s=r; % Scramble with random signal
X[0]=s; % Communicate dedicated scrambling signal
X[15:1]=bitxor(D[15:1], s); % Bitwise XOR with s
% Descramble
d=X[0];
Y[15:1]=bitxor(X[15:1], d); % Bitwise XOR with d
[0]=;

Because this method necessitates an additional explicit scrambling signal, a 16 bit wide data port X can only support up to 15 bits ADCs.

Using a truly random scrambling signal promises powerful scrambling, but necessitates an LSFR as random bit generator, which could introduce additional noise.

Next, the method "LSB" according to an exemplary embodiment will be described.

This method can transport 16 Bit ADC data D over a 16 bit wide scrambled port X, without requiring a dedicated scrambling bit as part of X.

Because the spectrum of the LSB in the first row 401 of FIG. 4 looks rather flat and thus random, the LSB of the digital word, D[0], is used as a scrambling signal s, and is then logically processed using an XOR function with all data bits, except the LSB bit itself, D[15:1]. If the LSBs were processed with an XOR function too, X[0] would be constant zero. For descrambling, the LSB is logically processed according to an XOR function again with all other data bits, reversing the initial XOR operation.

% Scramble
s=D[0]; % Scramble with LSB
X[0]=D[0]; % Keep LSE (scrambling signal) as is
X[15:1]=bitxor(D[15:1], s); % Bitwise XOR with s
% Descramble
d=X[0];
Y[15:1]=bitxor(X[15:1], d); % Bitwise XOR with d
Y[0]=X[0]; % Keep LSB as is Except for the LSB, the descrambling operation is the same as for the previously described method, "Random". The hardware implementation of this embodiment is very simple.

Next, the method "Data" according to another exemplary embodiment of the invention will be described.

Unlike the previously explained "LSB" method, which uses just the LSB, this method strives increasing randomness by including all data bits, D[15:0], in the scrambling signal s, which is then logically processed with an XOR function with all 16 data bits. As a result, the i-th scrambled bit, X[i], is the XOR of all data bits D[j] except the i-th bit, j≠1, because the i-th bit is included in two XOR terms. For an even number of bits, the same operation performs also descrambling.

% Scramble
s=XOR(D[15:0]); % XOR of all 16 data bits
X[15:0]=bitxor(D[15:0], s); % Bitwise XOR of ALL bits with s
% Descramble
d=XOR(X[15:0]); % XOR of all 16 scrambled bits
Y[15:0]=bitxor(X[15:0], d); % Bitwise XOR of ALL bits with d Operations are symmetrical with respect to data bits, making implementation easier for a variable number of data bits.

The effectiveness of descrambling using the same operation can be understood by looking at Y[0] of 4 bit wide data as an example.

X[0]=+D[1]+D[2] D[3]
X[1]=D[0]+D[2]+D[3]
X[2]=D[0]+D[1]+D[3]
[3]=D[0]+D[1]+D[2]
Y[0]+X[1]+X[2]+X[3]

In X[1], X[2] and X[3] combined, all data bits are included twice and cancel out when being processed using an XOR function, except for D[0] which is included three times. That is to say, Y[0]=D[0]. Similar collapsing occurs with the other bits of Y, because scrambling and descrambling are symmetrical with respect to data bits.

The mentioned cancellation of terms occurs only when the width of X is even, which is not a relevant restriction.

In the following, the method "Random+Data" according to another exemplary embodiment of the invention will be explained.

When the converter has no more than 15 data bits, the LSB can be freed up, and the above-mentioned method "Data" can be further improved or refined by connecting the LSB, D[0], to a truly random signal r. From there on the same scrambling and descrambling can be applied.

% Scramble
D[0]=r; % Make the LSB truly random, D[15:1] from ADC
s=XOR(D[15:0]); % XOR of random signal and 15 bit data
X[15:0]=bitxor(D[15:0], s); % Bitwise XOR of ALL bits with s
% Descramble
d=XOR(X[15:0]);
Y[15:0]=bitxor(X[15:0], d); % Bitwise XOR of ALL bits with d Next, referring to FIG. 4 in further detail, a comparison of the various methods described will be performed.

FIG. 4 illustrates a spectra of scrambled digital bits X without scrambling (first row 401), with scrambling method "Random" (second row 402), with scrambling method "LSB" (third row 403), with scrambling method "Data" (fourth row 404), and with scrambling method "Random+Data" (fifth row 405).

First, spur suppression of the above-mentioned methods is compared to no scrambling, using a single sine wave with an amplitude of 99% of full scale and 499 periods captured in 4096 samples. FIG. 4 shows the detailed power spectral densities of the LSB (left column 406), the MSB (middle column 407), and the arithmetic sum of all bits (right column 408). This is shown first without scrambling (first row 401), and then for all described methods "Random" (second row 402), "LSB" (third row 403), "Data" (fourth row 404), and "Random+Data" (fifth row 405). A MATLAB program listing will be given below.

Because of the included random signal, spur suppression of methods "Random" and "Random+Data" varies by about ±1 db.

Table 1 compares all methods with respect to spur suppression of the sum of all bits, maximum number of converter data bits over a 16 bit wide interface, and descrambling method.

Thus, Table 1 provides the comparison of all described scrambling methods.

TABLE 1

| Method | Spur suppression | Max converter bits | Descrambling with |
| --- | --- | --- | --- |
| Random | 20 dB | 15 | LSB |
| LSB | 17 dB | 16 | LSB |
| Data | 18 dB | 16 | XOR of all |
| Random + Data | 20 dB | 15 | XOR of all |

Both methods that include a truly random signal show the best results, 20 dB suppression. Using all data bits is only 2 dB less effective, while the LSB method is least effective, still suppressing spurs by 17 dB. Overall, the performance results as surprisingly similar, allowing other criteria to influence the selection. More complex scrambling, as mentioned above, is not needed.

Method "Data" may be particularly advantageous for 16 bit ADCs and, due to its simplicity, also for ADCs with fewer bits. For up to 15 bit ADCs, method "Random+Data" could be supported with the same descrambling method.

In the following, a hardware architecture according to an exemplary embodiment of the invention will be described.

One simple hardware architecture can support all three described methods, "Random", "Data", and "Random+Data". In all three cases, the descrambling signal d can be represented as the weighted sum of scrambled bits X[15:0], which is applied to all scrambled bits X[15:0].

d=XOR(W[0] & X[0], W[1] & X[1], ..., W[15] & X[15])
Y[15:0] bitxor(X[15:0], d)

When the weight word W is programmable, all relevant cases can be represented in a single architecture. For further details, see Table 2.

TABLE 2

| Method | Weight | Descrambling signal | Notes |
| --- | --- | --- | --- |
| Random | W[15:0] = 0 ... 01\b | d = X[0] | |
| LSB | N.A. | N.A. | Not supported |
| Data | W[15:0] = 1 ... 11\b | d = XOR(X[0], X[1], ..., X[15]) | |
| Random + Data | | | Y[0] = 0 |
| Nothing | W[15:0] = 0 ... 00\b | d = 0 | |

Figure 5:
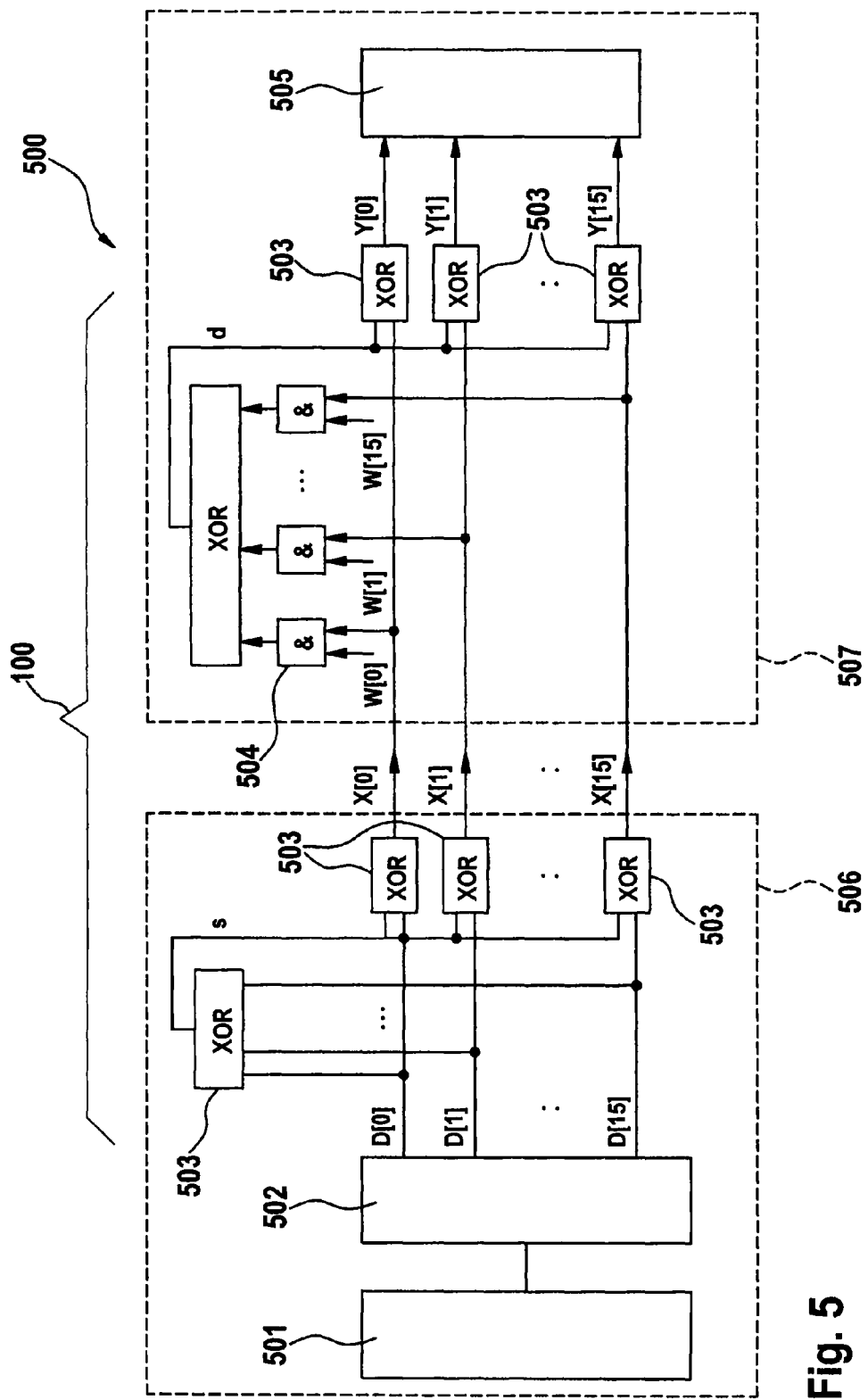
FIG. 5 shows a device for processing data for a test apparatus according to an exemplary embodiment of the invention.

FIG. 5 shows a measurement apparatus 500, for instance a test device for testing a device under test, in which the scrambling and descrambling scheme according to an exemplary embodiment of the invention is implemented.

A data generation unit 501 generates data, for instance data related to a test sequence or a test for testing devices under test (DUT). This data may be supplied to an analog-to-digital converter 502 which converts the data from an analog format into a digital format. The digital data items D[i] are converted into scrambled data items X[i] by scrambling the data items D[i] with these data items D[i]. For this purpose, XOR units 503 are provided to perform the corresponding logical linkages.

Then, the processed signals are transmitted to a unit in which the original data signals are recovered. The signals X[i] are logically connected in (optional) AND units 504 which logically couple the signals X[i] with control signals W[i] allowing to select, in a user-defined manner, a desired scrambling scheme (for instance "LSB" or "Data"). Then, the signals at the outputs of the AND units 504 are supplied to a further XOR unit 503 which provides at its output signals which are processed in combination with the signals X[i] using further XOR blocks 503. At an output of the further XOR blocks 503, the processed signals Y[i] are provided which may be supplied to a test processor 505 as a basis for testing DUTs.

A first block 506 in FIG. 5 is an analog front-end with data driven scrambling, and a second block 507 may be denoted as a descrambling part in a test processor. The second block 507 in FIG. 5 shows the descrambling architecture for a test processor, the first block 506 shows a scrambling method data in an analog front end. Thus, FIG. 5 illustrates a descrambling architecture for a test processor shown with data driven scrambling in front-end.

When applying the descrambling architecture of FIG. 5 to method "Random", Y[0] becomes constant zero, as desired, because the random bit X(0) is logically processed according to an XOR function with itself.

Concluding, simple data-driven scrambling may be provided, which does not necessitate an additional scrambling signal, and which suppresses spurs essentially as effectively as truly random scrambling and is therefore appropriate for many cases.

A simple generic descrambling hardware architecture is disclosed for test processes, which supports data driven scrambling of ADCs with up to 16 bits and more, and random scrambling of ADCs with up to 15 bit or more. The scrambled word width should be even.

Analog front ends, for instance for an Agilent 93000 test processor should support a compatible and effective scrambling method.

Scrambling of DAC data can occur in preprocessing software that fills (scrambled) sample memory.

It should be noted that the term "comprising" does not exclude other elements or features and the "a" or "an" does not exclude a plurality. Also elements described in association with different embodiments may be combined. It should also be noted that reference signs in the claims shall not be construed as limiting the scope of the claims.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A device for processing data, the device comprising:
   a scrambling unit adapted for scrambling a digital version of the data into scrambled digital data based on at least a part of the digital version of the data which is used as a signal to scramble the data, to thereby decorrelate the scrambled digital data with respect to an analog version of the data,
   wherein said scrambling comprises logically combining bits of the digital version of the data with each other, and
   wherein the at least a part of the digital version of the data which is used as a signal to scramble the data is obtainable from the scrambled digital data, but is not appended to the scrambled digital data.

2. The device of claim 1, wherein the scrambling unit is adapted for scrambling currently processed data based on the currently processed data.

3. The device of claim 1, wherein the scrambling unit is adapted for scrambling currently processed data based on previously processed data.

4. The device of claim 1, wherein the scrambling unit is adapted for scrambling currently processed data based on the currently processed data and based on previously processed data.

5. The device of claim 1, wherein the scrambling unit is adapted for scrambling the data based on exactly one bit of the data.

6. The device of claim 1, wherein the scrambling unit is adapted for scrambling the data based on the entire data.

7. The device of claim 1, wherein the scrambling unit is adapted for scrambling the data by logically combining the data with at least a part of the data.

8. The device of claim 1, wherein the scrambling unit is adapted for scrambling the data by logically combining the data with at least a part of the data using an invertible Boolean function.

9. The device of claim 8, wherein the invertible Boolean function is one of the group consisting of an XOR function, an AND function, an OR function, an inverter function, and any logical combination of an XOR function, an AND function, an OR function, and an inverter function.

10. The device of claim 1, wherein the scrambling unit is adapted for scrambling the data based on at least a part of the data and based on a random signal provided by a random signal generation unit.

11. The device of claim 1, further comprising a conversion unit for converting the data into converted data.

12. The device of claim 11, wherein the conversion unit is adapted for converting between analog data and digital data.

13. The device of claim 11, wherein the conversion unit is adapted for converting digital data as the data into analog data as the converted data.

14. The device of claim 11, wherein the conversion unit is adapted for converting analog data as the data into digital data as the converted data.

15. The device of claim 1, further comprising a descrambling unit adapted for descrambling the scrambled data based on at least a part of the data.

16. A device for processing data, the device comprising:
a scrambling unit adapted for scrambling a digital version of the data into scrambled digital data based on at least a part of the digital version of the data, to thereby decorrelate the scrambled digital data with respect to an analog version of the data,
wherein said scrambling comprises logically combining bits of the digital version of the data with each other, and
wherein the scrambling unit is adapted for scrambling the data based on a Least Significant Bit of the data.

17. A measurement apparatus, comprising:
a data generation unit adapted to generate data related to a measurement carried out by the measurement apparatus; and
a device, the device comprising
a scrambling unit adapted for scrambling a digital version of the data into scrambled digital data based on at least a part of the digital version of the data which is used as a signal to scramble the data, to thereby decorrelate the scrambled digital data with respect to an analog version of the data,
wherein said scrambling comprises logically combining bits of the digital version of the data with each other, for processing the generated data so as to scramble the generated data based on at least a part of the generated data, and
wherein the at least a part of the digital version of the data which is used as a signal to scramble the data is obtainable from the scrambled digital data, but is not appended to the scrambled digital data.

18. The measurement apparatus of claim 17, further comprising at least one of an analog-to-digital converter, a digital-to-analog converter, a sensor device, a test device for testing a device under test or a substance, a device for chemical, a biological and/or pharmaceutical analyzer, a fluid separation system adapted for separating compounds of a fluid, a capillary electrophoresis device, a liquid chromatography device, a gas chromatography device, an electronic measurement device, and a mass spectroscopy device.

19. A method of processing data, the method comprising:
scrambling a digital version of the data into scrambled digital data based on at least a part of the digital version of the data which is used as a signal to scramble the data, to thereby decorrelate the scrambled digital data with respect to an analog version of the data,
wherein said scrambling comprises logically combining bits of the digital version of the data with each other, and
wherein the at least a part of the digital version of the data which is used as a signal to scramble the data is obtainable from the scrambled digital data, but is not appended to the scrambled digital data.

20. A non-transitory computer-readable storage medium, in which a computer program of processing data is stored, which computer program, when being executed by a processor, is adapted to control or carry out a method of:
scrambling a digital version of the data into scrambled digital data based on at least a part of the digital version of the data which is used as a signal to scramble the data, to thereby decorrelate the scrambled digital data with respect to an analog version of the data,
wherein said scrambling comprises logically combining bits of the digital version of the data with each other, and
wherein the at least a part of the digital version of the data which is used as a signal to scramble the data is obtainable from the scrambled digital data, but is not appended to the scrambled digital data.

21. A device for processing data, the device comprising:
a descrambling unit adapted for descrambling scrambled digital data into a digital version of the data based on at least a part of the scrambled digital data which is used as a signal to scramble the data so that the scrambled digital data provided at a digital input of the descrambling unit is decorrelated with respect to an analog version of the data,
wherein said descrambling comprises logically combining bits of the scrambled digital data with each other, and
wherein the at least a part of the digital version of the data which is used as a signal to scramble the data is obtainable from the scrambled digital data, but is not appended to the scrambled digital data.

22. A method of processing data, the method comprising:
descrambling scrambled digital data into a digital version of the data based on at least a part of the scrambled digital data which is used as a signal to scramble the data so that the scrambled digital data provided at a digital input is decorrelated with respect to an analog version of the data,
wherein said descrambling comprises logically combining bits of the scrambled digital data with each other, and
wherein the at least a part of the digital version of the data which is used as a signal to scramble the data is obtainable from the scrambled digital data, but is not appended to the scrambled digital data.

* * * * *